United States Patent
Whannel et al.

(10) Patent No.: US 6,865,704 B2
(45) Date of Patent: Mar. 8, 2005

(54) SCAN MULTIPLEXING FOR INCREASING THE EFFECTIVE SCAN DATA EXCHANGE RATE

(75) Inventors: Stuart L. Whannel, San Jose, CA (US); Garrett O'Brien, Sunnyvale, CA (US); John Stephen Walther, Sunnyvale, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 466 days.

(21) Appl. No.: 10/007,825

(22) Filed: Nov. 9, 2001

(65) Prior Publication Data

US 2003/0093731 A1 May 15, 2003

(51) Int. Cl.[7] .............................................. G01R 31/28
(52) U.S. Cl. ...................................................... 714/726
(58) Field of Search ................................ 714/726, 724, 714/729, 733, 735, 736, 739, 718, 719; 324/765

(56) References Cited

U.S. PATENT DOCUMENTS

| | | | |
|---|---|---|---|
| 4,736,375 A | 4/1988 | Tannhauser et al. | |
| 5,127,011 A | 6/1992 | Combs et al. | |
| 5,381,421 A | 1/1995 | Dickol et al. | |
| 5,825,785 A | 10/1998 | Barry et al. | |
| 6,067,651 A | 5/2000 | Rohrbaugh et al. | |
| 6,097,206 A | * 8/2000 | Takano | ........................ 324/765 |
| 6,477,672 B1 | * 11/2002 | Satoh | .......................... 714/721 |

* cited by examiner

*Primary Examiner*—Albert DeCady
*Assistant Examiner*—James C. Kerveros

(57) ABSTRACT

Simultaneously increasing the effective frequency of scanning operations and increasing memory capacity can be achieved by multiplexing multiple state data into each tester memory location. A system includes a source for providing scan-in sequences of state data as input stimuli into a device under test (DUT) and expected scan-out sequences of state data. A vector processor receives the scan-in sequences and expected scan-out sequences and enables multiplexed state data exchanges in which the multiple multiplexed state data vectors are manipulated at the tester cycle rate, while the DUT manipulates the bits at its faster device cycle rate. For a multiplexing factor of m, the device cycle rate may be m times the tester cycle rate. The selection of the multiplexing factor is based upon the storage capacity of individual tester memory locations and upon enabling the effective vector exchange rate to be m times the tester cycle rate.

18 Claims, 7 Drawing Sheets

| | | |
|---|---|---|
| 84 | 86 | 88 |
| WAVEFORM FUNCTION INDICATOR 1 | 0 0 0 | |
| WAVEFORM FUNCTION INDICATOR 2 | 0 0 1 | |
| WAVEFORM FUNCTION INDICATOR 3 | 0 1 0 | |
| WAVEFORM FUNCTION INDICATOR 4 | 0 1 1 | 90 |
| WAVEFORM FUNCTION INDICATOR 5 | 1 0 0 | |
| WAVEFORM FUNCTION INDICATOR 6 | 1 0 1 | |
| WAVEFORM FUNCTION INDICATOR 7 | 1 1 0 | |
| WAVEFORM FUNCTION INDICATOR 8 | 1 1 1 | |

FIG. 4A

| | | |
|---|---|---|
| WAVEFORM FUNCTION INDICATOR 9 | 0 0 | |
| WAVEFORM FUNCTION INDICATOR 10 | 0 1 | |
| WAVEFORM FUNCTION INDICATOR 11 | 1 0 | |
| WAVEFORM FUNCTION INDICATOR 12 | 1 1 | |

FIG. 4B

SCAN MULTIPLEXING FOR INCREASING THE EFFECTIVE SCAN DATA EXCHANGE RATE

TECHNICAL FIELD

The invention relates generally to the testing of integrated circuit (IC) components, and more particularly to a method and system of storing data in IC testing.

BACKGROUND ART

Continuing increases in the complexity and density of integrated circuit (IC) components within a circuit chip have imposed an escalating challenge to the testing of such circuitry. By some estimation, the cost of testing can contribute up to 20% to the total cost of manufacturing. To achieve economy of scales, it is critical that the cost of testing be minimized.

Minimizing cost in high-volume manufacturing requires that the testability of the circuitry be considered up front since both time and money are required to achieve a desired level of quality. Various techniques for testing have existed for many years. A technique that has gained widespread acceptance in the testing community is scan-based testing. In detecting faults within the IC components, various forms of scan-based testing are used for maximizing accessibility and observability. Accessibility is the ability to establish specific state data at the desired nodes of the IC components, while observability is the ability to determine specific state data at any node within the IC components.

The terms "state" and "state data" will be used interchangeably and are each defined as a symbol or representation of encoded information utilized for data processing, and may be represented by a waveform.

In scan-based testing, an input test sequence of scan-in states (i.e., input stimulus of logic 0 or logic 1) are serially shifted into a scan chain of a device under test (DUT). A number of test executions are performed on the DUT during successive tester cycles to produce in the scan chain an output test sequence of scan-out states (i.e., output responses of logic 0 or logic 1). The output test sequence is subsequently shifted out of the scan chain and compared with a known sequence of expected states (i.e., expected responses of logic 0, logic 1, don't care, or high-impedance) for determining possible faults within the DUT. For a typical DUT having a large array of IC components, a lengthy scan data sequence is needed to test the embedded combinational logics of the IC components.

While conventional scan-based testing provides a high degree of accessibility and observability, a concern with utilizing a lengthy scan data sequence is that the quantity of scan state data can easily exceed the number of available tester memory locations within the IC tester. A means for resolving the problem of limited availability of tester memory locations is to use multiple scan chains during testing, rather than one lengthy scan chain. One of the drawbacks with this approach is that additional hardware (e.g., scan-in and scan-out pins) is needed to serially shift the multiple scan-chain state data into positions for testing and to serially shift the scan-chain state data out from the DUT for comparing. Such a modification adds to the cost of fabrication. Another concern with utilizing a lengthy scan chain is that the time required to test all the IC components within the DUT can be time-consuming, if each state of scan-in data is entered and each state of scan-out data is compared at the slower of the operation speed of the device (i.e., the device cycle rate) and the operation speed of the tester (i.e., the tester cycle rate). Currently, the continuous increases in the device cycle rate of circuit chips outpace the increases in tester cycle rate that can be achieved by tester upgrades or tester replacement. Thus, the tester cycle rate dictates the speed of the testing operation.

What is needed is a testing method for evaluating IC components within a DUT that is both cost-productive and time-efficient.

SUMMARY OF THE INVENTION

The invention is a method and system of storing information relating to integrated circuit (IC) scan testing that utilizes coded sequences of scan-in state data and scan-out state data. The state data is multiplexed in separately accessible memory locations, with the multiplexing being based on the storage capacity of the individual memory locations and upon enabling an effective scan data exchange rate that is a multiple (m) of a tester cycle rate. By multiplexing the scan data, the scanning operation is not restricted to the rate of the tester cycles. Rather, the scanning operations may proceed at the device cycle rate of the IC device undergoing testing.

The term "multiplexing" is herein defined as a grouping of a number of state data into a single memory location. The multiplexing occurs once for every tester cycle. At least two states are grouped into each memory location for every tester cycle. The scan-in states are representative of input stimuli. The scan-out states are output expected responses of the IC undergoing testing. By multiplexing scan state data into a particular memory location at a specific tester cycle, multiple (m) device cycles can be grouped into the tester cycle.

In one aspect of the invention, a sequence of scan-in state data is serially shifted into an arrangement of bistable storage elements during device cycles to set the storage elements in a configuration for testing. The bistable storage elements may be flip-flops. The resulting scan chain data is then transferred in successive tester cycles into the IC components, such as gates, for testing the circuitry. Each element of the scan chain receives a response for the IC component which then can be serially shifted out to the tester.

For a multiplexing factor of m, there are m states grouped together which define a multiplexed waveform. Thus, each multiplexed waveform includes m timing edges for each timing edge needed to represent a scan state. For example, if an original scan-in state data has an edge at time t with respect to the period p, then the multiplexed scan-in waveform will have edges at:

$$(t+ip)/m \text{ for } i=0 \text{ to } (m-1).$$

The multiplexing factor m is selected such that for each tester cycle that occurs at the tester cycle rate, m number of scan states are exchanged between an individual memory location and the DUT, while the DUT processes one state for each device cycle. As an aspect of the invention, the device cycle rate is a whole number multiple of the tester cycle rate and the whole number multiple is equal to m.

If the multiplexing factor does not exceed the number of waveform state parameters allowed by the tester, then the tester waveforms may be written using the state parameters. However, if the multiplexing factor is greater than the number of allowed waveform state parameters, the tester waveforms may be written using fixed edges. The use of written state parameters is preferred, since it facilitates the reading of the scan data on the tester.

The scan multiplexing solution permits the grouping of multiple scan states into a single tester memory location, thereby effectively multiplying the capacity of the tester memory. The solution also increases the effective scan test frequency, so that the total testing time is reduced.

BRIEF DESCRIPTION OF THE DRAWINGS

FIG. 4A is a representation of the waveform storage of FIG. 1.

FIG. 4B is an alternative representation of the waveform storage of FIG. 1.

DETAILED DESCRIPTION

Figure 1:
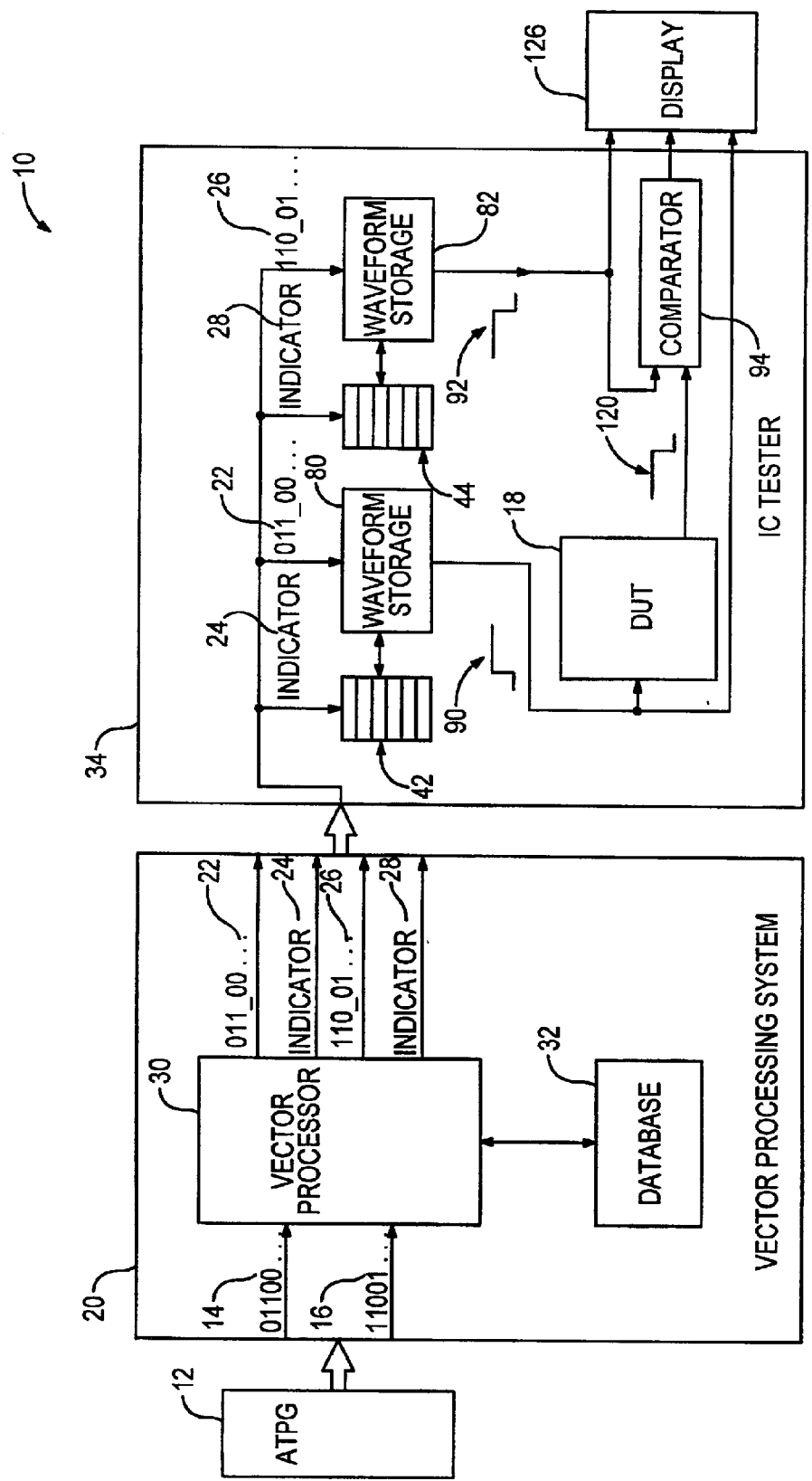
FIG. 1 is a block diagram of a system for compressing information in memory in an automatic test generation (ATG) application in accordance with the invention.

FIG. 1 shows a system 10 for multiplexing information in memory in an automatic test generation (ATG) application. The system is particularly suited for use in scan-based testing of integrated circuit (IC) components embedded within an IC chip. The system includes an automatic test pattern generator (ATPG) 12 that provides a sequence of scan-in state data 14 and a sequence of expected scan-out state data 16 that are specifically written for a device under test (DUT) 18. As shown, the sequence of scan-in state data 14 is represented by an exemplary partial sequence of scan-in states of "01100." Likewise, the sequence of expected scan-out state data 16 is represented by an exemplary partial sequence of scan-out states of "11001." The ATPG is coupled to a vector processing system (VPS) 20. In one aspect of the invention of which will be fully described below, the VPS multiplexes the sequence of scan-in state data into a sequence of multiplexed scan-in state data 22 and generates tester waveform function indicators 24. Each indicator 24 corresponds to a portion of the sequence of multiplexed scan-in state data. Moreover, the sequence of expected scan-out state data is multiplexed into a sequence of multiplexed expected state data 26. A tester waveform function indicator 28 is generated for each corresponding portion of the sequence of multiplexed expected scan-out state data. The multiplexing is performed by a vector processor 30 of the VPS. A database 32 is included within the VPS and is operationally coupled with the vector processor for storing the sequences of multiplexed state data and the tester waveform function indicators. The multiplexed state data and the indicators are provided to an IC tester 34 for the testing of the DUT.

The underscores of the sequences 22 and 26 distinguish between a first combination and a next combination of multiplexed state data. While the first combination is shown as including three states and the next combination is shown as including two states, each successive combination includes a same number of states.

Figure 2:
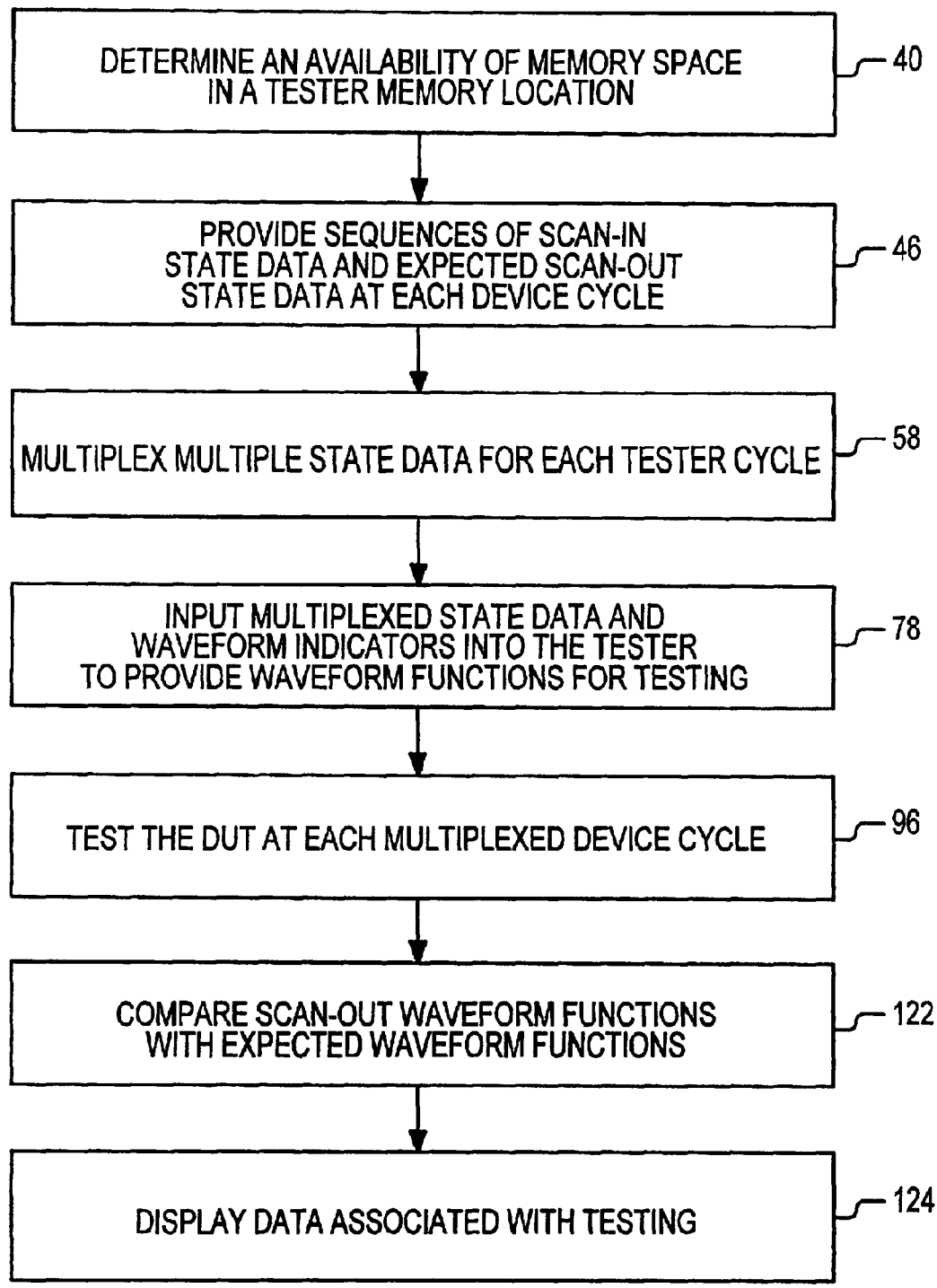
FIG. 2 is a process flow diagram for multiplexing information in memory in an ATG application in accordance with the system of FIG. 1.

With reference to FIG. 1, FIG. 2 shows a process flow of steps by the vector processor 30 for multiplexing the sequences of scan-in state data 14 and expected scan-out state data 16 to respective sequences of multiplexed scan-in state data 22 and multiplexed expected state data 26. In step 40, an availability of memory space within each tester memory location 42 or 44 of the tester 34 is determined. Each tester memory location is assumed to comprise the same amount of memory space as every other tester memory location and there is sufficient memory space within each tester memory location to store more than one state.

In step 46, the sequences of scan-in state data 14 and expected scan-out state data 16 are provided by the ATPG 12 and received by the vector processor 30. Each scan-in state may be an input stimuli of logic 0 or logic 1, while each expected scan-out state may be a logic 0, logic 1, don't care or high-impedance. Each state is generated by the ATPG for each device cycle. However, multiplexing the state data by the vector processor in the manner to be described enables multiple states to be available for each tester cycle.

In operation, since the tester 34 performs at a tester frequency that is slower than a device frequency of the DUT 18, the tester frequency dictates the speed of the testing operation. In a timing diagram 48 of FIG. 3, a tester clock 50 operates at a tester cycle 52 of 100 ns. The time period of 100 ns is selected only for the purpose of illustration and is by no means meant to be limiting.

Without the benefit of multiplexing, each non-multiplexed scan-in state received by a device undergoing testing and each non-multiplexed scan-out state that is an output of the device is clocked at each non-multiplexed device cycle that is dictated by the time period of the tester cycle. That is, with reference to FIG. 3, a time period of a non-multiplexed device cycle 54 of a device clock 56 is equivalent to the time period of the tester cycle 52 of the tester clock 50 when the device cycle is dictated by the time period of the tester cycle. Moreover, each state of the sequence 14 (FIG. 1) having the exemplary portion of scan-in state data of "01100" is clocked per non-multiplexed device cycle. Although the sequence comprises only five exemplary states, in actual implementation, a much longer scan sequence is typically required for testing. While not shown in FIG. 3, each state of the sequence 16 of FIG. 1 is also clocked per non-multiplexed device cycle.

Figure 3:
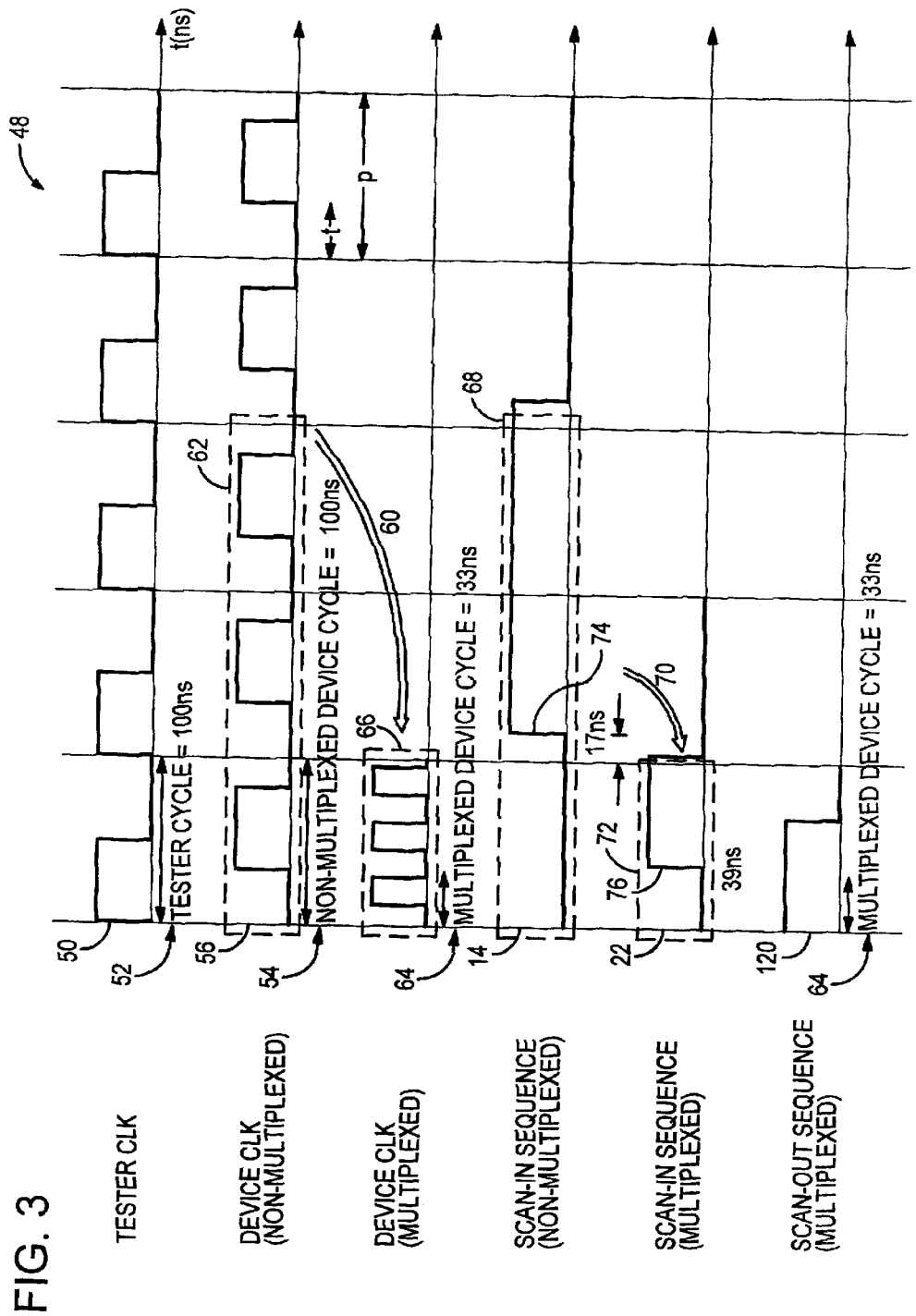
FIG. 3 is a timing diagram illustrating the timing relationship for data running at a non-multiplexed device cycle and a multiplexed device cycle in accordance with the invention.

Returning to FIG. 2 and with reference to FIGS. 1 and 3, step 58 provides multiplexing by the vector processor 30 of FIG. 1, to enable multiple scan-in state data 14 and multiple scan-out state data 16 to be available at each tester cycle 52. In a first exemplary embodiment, there is sufficient memory space for compressing three non-multiplexed device cycles into each tester memory location per tester cycle. As shown in FIG. 3, an exemplary multiplexing factor of three compresses (shown by an arrow 60) three non-multiplexed device cycles 54 (shown in a dashed block 62) of the non-multiplexed device clock 56 into one tester cycle 52, resulting in three multiplexed device cycles 64 (shown in a dashed block 66) within one tester cycle. By multiplexing, three multiplexed device cycles 64 are stored into one tester cycle 52.

By compressing multiple non-multiplexed device cycles 54 into each tester cycle 52, each non-multiplexed state data corresponding to a non-multiplexed device cycle is likewise compressed. As shown in FIG. 3, the three exemplary scan-in state data of "011" of the sequence 14 (FIG. 1) in the three non-multiplexed device cycles 54 (shown in a dashed block 68) are compressed (shown by an arrow 70) into one tester cycle 52, resulting in a partial sequence of the multiplexed scan-in state data 22 of FIG. 1 (shown in a dashed block 72). By multiplexing, three bits of state data in respective non-multiplexed device cycles are stored into one tester cycle.

In a second exemplary embodiment, there is sufficient memory space for compressing two non-multiplexed device cycles, resulting in the storage of two bits of state data within one tester cycle. Depending upon the availability of memory space within each tester memory location, in some applications, more than three device cycles and thus, more than three corresponding bits of state data, can be stored at each memory location per tester cycle.

For a multiplexing factor of m, there are m consecutive multiplexed device cycles per tester cycle. Similarly, for every timing edge of the non-multiplexed scan-in sequence, there is a possibility of m edges for the multiplexed scan-in sequence per tester cycle. If the non-multiplexed scan-in state includes an edge at a time t with respect to the period p, the multiplexed scan-in sequence of states will include edges at:

$$(t+ip)/m \text{ for } i=0 \text{ to } (m-1).$$

In FIG. 3, the time t and the period p are shown with respect to one non-multiplexed device cycle 54 of the non-multiplexed device clock 56. The period p corresponds to one non-multiplexed device cycle. Applying the equation, a rising edge 74 at approximately 17 ns at the second non-multiplexed device cycle of the non-multiplexed scan-in sequence 14 corresponds to a rising edge 76 at approximately 39 ns at the first tester cycle of the multiplexed scan-in sequence 22. In the example shown, three multiplexed device cycles 64 are driven for every tester cycle 52.

While FIG. 3 illustrates multiplexing the non-multiplexed scan-in sequence 14 into the multiplexed scan-in sequence 22 for every tester cycle, the same methodology applies to multiplexing other types of non-multiplexed sequences of state data, including the non-multiplexed sequence 16 of FIG. 1 into the multiplexed sequence 26.

Subsequent to multiplexing, multiple bits of state data are stored in the same tester cycle. If a scan sequence of state data is defined by the number of states that can be stored in tester memory, the length of the sequence is increased by a multiplexing factor of m. As an example, for an IC tester comprising 8 million tester memory locations and therefore, having 8 million tester cycles, without multiplexing (i.e., m=1) there is a storage capacity for a sequence having 8 million bits of state data. However, for the same IC tester which is configured to multiplex by a multiplexing factor of m, where m=3, there is a storage capacity for a sequence that allows for 24 million bits of state data.

Alternatively, the number of required tester memory locations can be reduced by the multiplexing factor of m. As an example, for a cumulative scan sequence comprising three million states of data and having a multiplexing factor of three, the number of required memory locations is reduced from 3 million to 1 million.

Equally important, the effective scan test frequency is increased by a rate corresponding to the multiplexing factor m. That is, the rate of testing is increased, so that the total amount of time required for testing is decreased. Without multiplexing, each bit of state data is stored at a separate tester memory location, with the storage occurring at every tester cycle and the tester cycle being clocked at the same rate as the non-multiplexed device cycle. With multiplexing in which multiple states are stored within a tester memory location at every tester cycle, each non-multiplexed device cycle can be reduced by the multiplexing factor m. Consequently, m number of device cycles are stored for every tester cycle. Utilizing the same multiplexing factor of three as an example, the device cycle is reduced by a factor of three. If the tester cycle remains at 100 ns, each non-multiplexed device cycle is reduced from 100 ns to approximately 33 ns. Consequently, the effective scan test frequency according to the new multiplexed device cycle of 33 ns is increased three hundred percent, causing the testing time to be reduced to one-third of the prior time for a fixed number of state data in a scan sequence.

Returning to FIG. 1, subsequent to the generation of the multiplexed scan-in sequence 22 and the multiplexed expected scan-out sequence 26, the tester waveform function indicators 24 and 28 are created. Each indicator is associated with a particular combination of multiplexed state data at every tester cycle. As an example, a "Waveform Function Indicator 4" may be associated with the combination of multiplexed state data of "011" in the partial multiplexed sequence of scan-in state data 22 within one tester cycle. The multiplexed sequences 22 and 26, and the waveform indicators 24 and 28 may be stored in the database 32. Alternatively, in a case in which multiplexing is performed immediately prior to the generation of test data, non-multiplexed sequences of scan-in state data 14 and expected scan-in state data 16 are stored in the database prior to multiplexing. The moment at which multiplexing is performed is not critical.

Referring to the flow diagram of FIG. 2 and with reference to FIG. 1, subsequent to the multiplexing step 58, step 78 provides inputting sequential combinations of multiplexed state data and the corresponding waveform indicators into the tester 34 to provide waveform functions for testing. The sequential combinations of multiplexed scan-in state data 22 and multiplexed expected scan-out state data 26 are transmitted to respective waveform storages 80 and 82. Moreover, the tester waveform indicators 24 and 28 are transmitted to respective tester memory locations 42 and 44. Each tester waveform function indicator provides a reference to a corresponding combination of multiplexed state data for every tester cycle to derive an expected waveform function in order to detect possible faults within the DUT.

FIG. 4A is a view of the waveform storage 80. Since the coded information corresponding to a combination of the multiplexed state data (e.g., a portion of the multiplexed scan-in sequence 22 comprising "011" of FIG. 3) in each tester cycle can be represented by a waveform function, each waveform function indicator in column 84 is matched against a list of the combination of multiplexed state data in column 86 to produce respective waveform function listed in column 88. For an exemplary multiplexing factor m of three (i.e., 3 multiplexed states per tester cycle) in which each state is either a logic 0 or logic 1, there are $2^m$ or 8 combinations of waveform functions. In the embodiment shown, "waveform function indicator 4" is referenced with the combination of multiplexed state data "011" to generate a waveform function 90. Referring to FIG. 1, the waveform function 90 is shown as an input into the DUT 18. For an exemplary multiplexing factor m of two (i.e., 2 multiplexed states per tester cycle) in which each state is either a logic 0 or logic 1, there are $2^m$, or 4, combinations of waveform functions. FIG. 4B shows an alternate view of the waveform storage 80 for waveform functions having two multiplexed states per tester cycle.

The methodology for generating waveform functions for testing as previously described applies equally to generating an exemplary waveform function 92 of FIG. 1 from the sequence 26 of multiplexed expected state data and the waveform function indicator 28. The waveform function 92 is provided as an output from the waveform storage 82 and is received by a comparator 94. In an alternative embodiment, the waveform storage 82 may be a same storage as the waveform storage 80. This is not critical.

In step 96 of FIG. 2, the testing of the DUT 18 is performed at each multiplexed device cycle even though the tester is running at a speed corresponding to the tester cycle. Each portion of the multiplexed combination of the waveform function (e.g., waveform function 90 of FIG. 4) corresponding to one bit of multiplexed scan-in state data is hereinafter referred to as a "multiplexed waveform portion." The number of multiplexed waveform portions in every tester cycle is dependent upon the multiplexing factor m. As an example, there are three multiplexed waveform portions for a multiplexing factor of three for every tester cycle. Accordingly, there is one multiplexed waveform portion for every multiplexed device cycle. Moreover, each multiplexed waveform portion corresponds to one bit of state data. Each multiplexed waveform portion is shifted in successive multiplexed device cycles into the DUT for testing.

Figure 5:
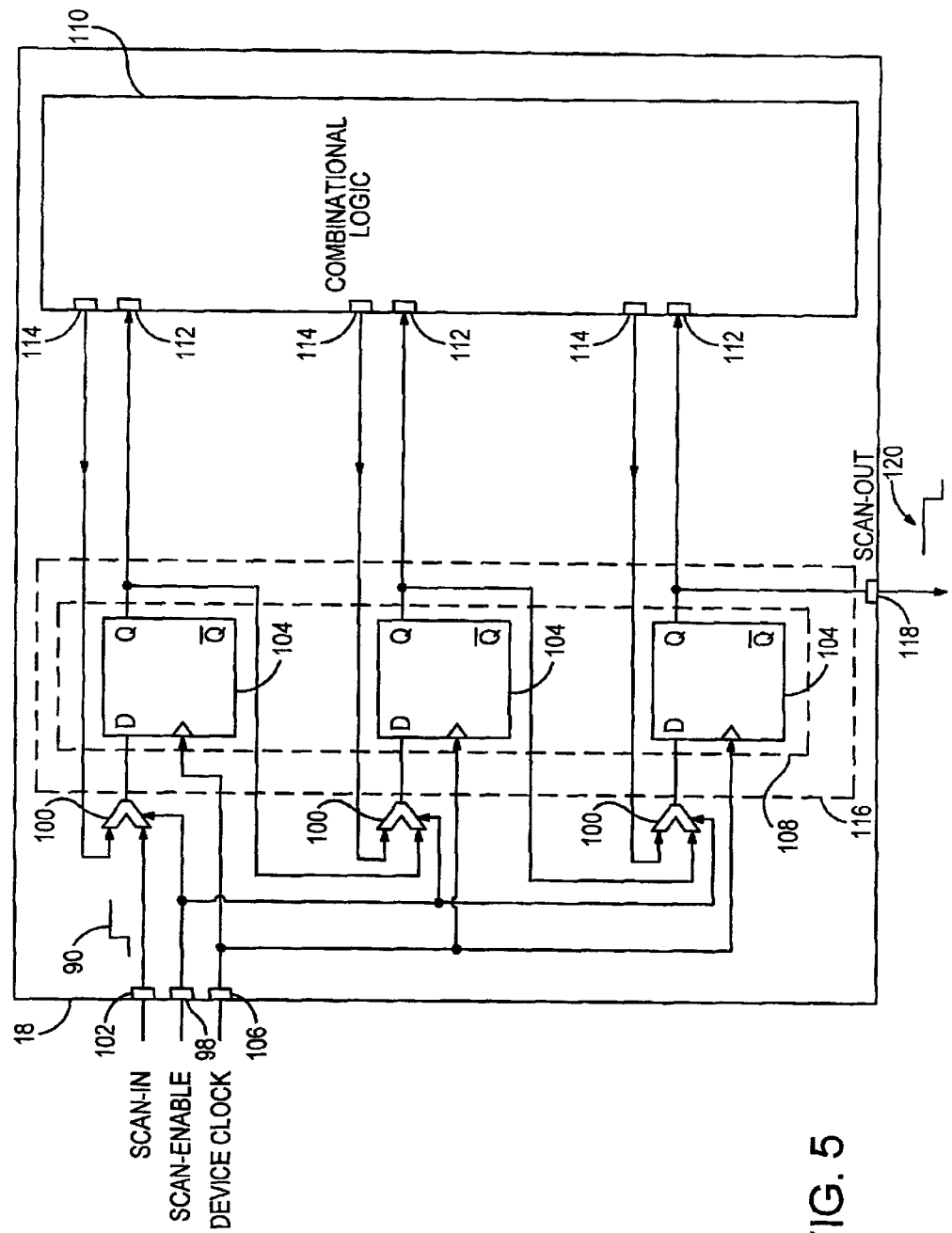
FIG. 5 is a schematic view of the device under test (DUT) of FIG. 1.

FIG. 5 shows a view of the DUT 18 of FIG. 1. A scan-enable pin 98 is employed as an input for sequencing multiplexors 100 to operate in the scan-based testing mode. A scan-in pin 102 is provided as an input for shifting each multiplexed waveform portion at successive multiplexed device cycles 64 (FIG. 3) into a number of bistable storage elements, such as D-type flip-flops 104. A device clock pin 106 is provided as an input to toggle each multiplexed scan-in data into the flip-flops to load an input scan chain 108 (shown as an inner dashed block). Subsequent to the loading of the input scan chain, the testing of combinational logic 110 (IC components) embedded within the DUT 18 is executed. While not shown, the combinational logic may include multiple types of logic elements, such as AND gates, NAND gates, OR gates and NOR gates. Once the input scan chain is programmed with the multiplexed scan-in data, the data is simultaneously transferred into the combinational logic at input nodes 112. The combinational logic produces output scan data at output nodes 114. Each output scan state is input into a respective flip-flop 104 through the corresponding multiplexor 100 to form an output scan chain 116 (shown as an outer dashed block). Each scan state of the output scan chain is shifted out from the DUT 18 through a scan-out pin 118 to form a scan-out sequence of multiplexed waveform functions 120. As shown in FIG. 3, the multiplexed waveform sequence 120 includes exemplary state data of "110". Each waveform portion that corresponds to a particular state is clocked out at the associated multiplexed device cycle 64. The partial scan-out sequence of multiplexed waveform functions 120 is also shown in FIG. 1 as a tested output from the DUT 18.

While the exemplary embodiment describes each of the input scan chain 108 and the output scan chain 116 as having three flip-flops, in actual practice, the input scan chain and the output scan chain may each comprise a much greater number of flip-flops (e.g., in the thousands), depending on various factors such as the number of IC components to be tested and the complexity of the IC.

In step 122 of FIG. 2 and with reference to FIG. 1, the sequence of scan-out multiplexed waveform functions 120 and the sequence of expected waveform functions 92 are compared by the comparator 94. The expected waveform functions includes known data for determining the functionality of the DUT. Each multiplexed waveform portion of the sequence 120 is compared with a respective portion of the sequence 92 of expected waveform functions. Depending on whether a fault is detected, a "PASS" or a "FAIL" is generated as an output of the comparing step.

Figure 6:
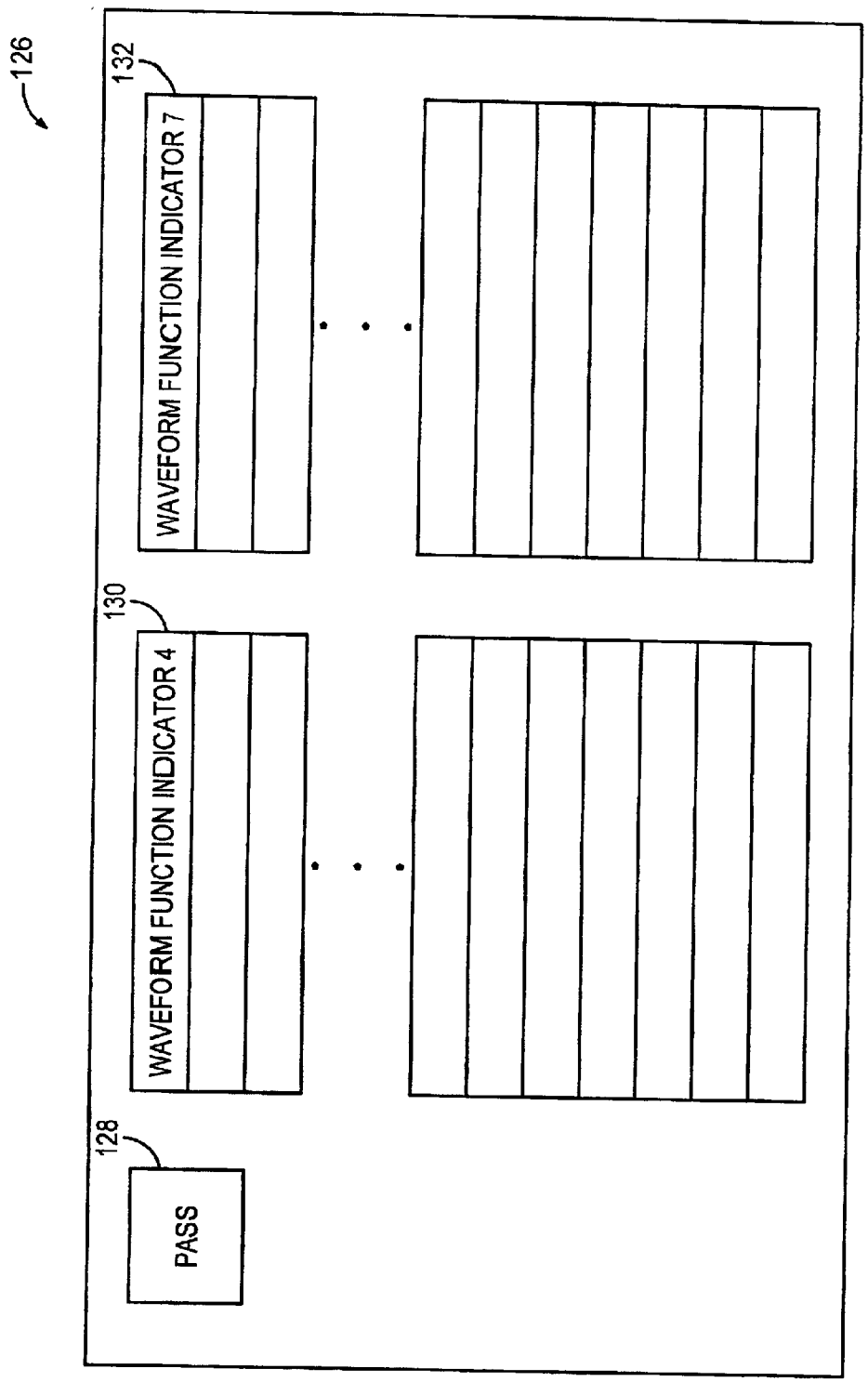
FIG. 6 is a schematic view of the display module of FIG. 1 displaying the scan-out state data as a waveform name.

In step 124, data associated with the testing of the DUT 18 is displayed on a display module 126 of FIG. 1. FIG. 6 shows an enlarged view of the display module which may be a computer monitor. A "PASS" generated by the comparator 94 is displayed in a first window 128 to show that the DUT 18 has passed the structural test imposed by the tester. In an embodiment in which the multiplexing factor of m is greater than the number of waveform state parameters attributed to the IC tester 34, a name associated with the waveform function indicator (e.g., "Waveform Function Indicator 4" assigned to the waveform function 90 of FIG. 4) is displayed. As an example, for a tester in which the number of maximum waveform state parameters is two, a name of the waveform function indicator is recorded, rather than the waveform scan states. The name "Waveform Function Indicator 4" is shown at a second window 130 in the display module for the waveform function 90. The waveform function indicator corresponds to one tester cycle and is provided by the waveform storage 80 (FIG. 1). Moreover, a name of the expected waveform function indicator (e.g., "Waveform Function Indicator 7")corresponding to the waveform function 92 is displayed in a third window 132.

Figure 7:
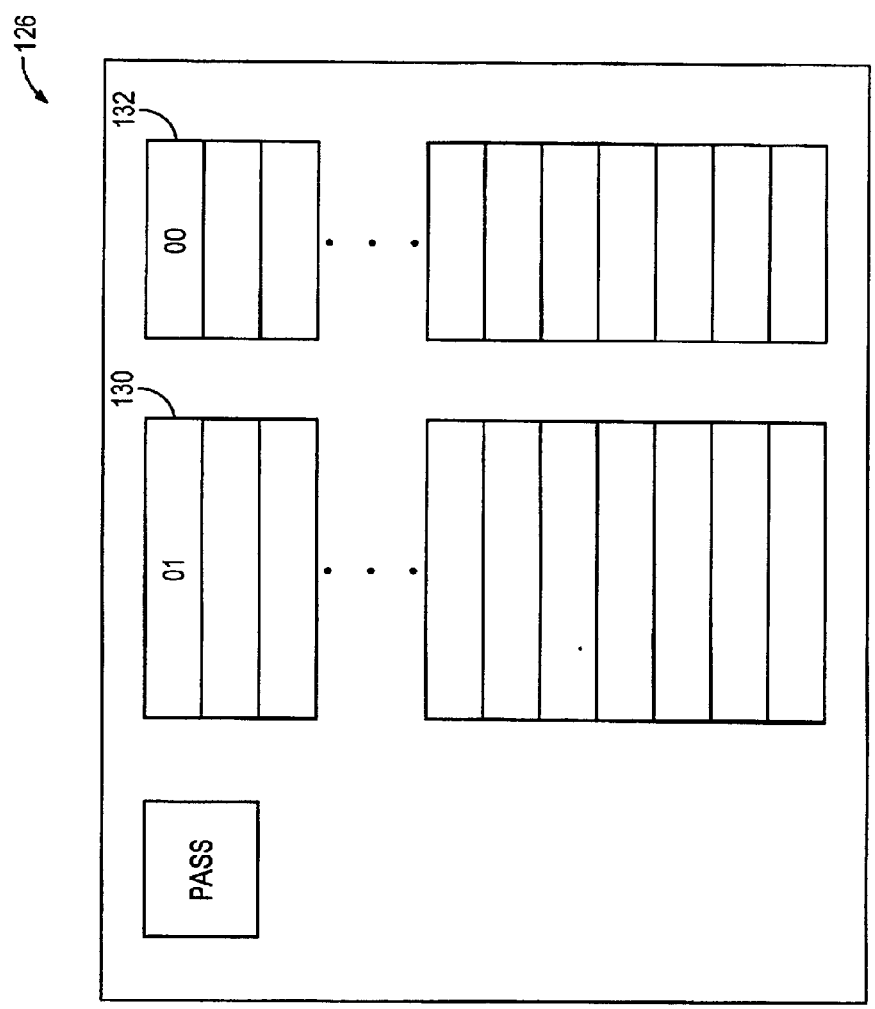
FIG. 7 is a schematic view of the display module of FIG. 1 displaying the scan-out state data in state parameter forms.

On the other hand, in an embodiment in which the multiplexing factor of m is not greater than the number of waveform state parameters enabled by the IC tester 34, the waveform function is displayed in scan state form, such as a sequence of a logic 1 and a logic 0. Presenting the multiplexed data in scan state form is preferred, since it allows the display to be read more easily. As an example, for the tester in which the number of maximum waveform state parameters is two, the multiplexed state data and the expected multiplexed state data are shown in scan state form as one of "00", "01", "10", and "11" for each tester cycle at respective windows 130 and 132. FIG. 7 shows the exemplary multiplexed state data of "01" in the window 130 and the expected multiplexed state data of "00" in the window 132 at the display module 126.

What is claimed is:

1. A method of storing information relating to integrated circuit (IC) scan testing using sequences of state data comprising the steps of:

identifying a tester cycle rate of a scan tester that is used to exchange said state data with a device under test (DUT);

identifying a device cycle rate of said DUT, said device cycle rate being greater than said tester cycle rate;

grouping a plurality of said state data into a plurality of separately accessible memory locations, including multiplexing at least some of said state data into said memory locations such that multiple said state data reside within individual said memory locations, said multiplexing being based on (1) a storage capacity of said individual memory locations, and (2) enabling an effective state data exchange rate that is a multiple (m) of said tester cycle rate, where m is greater than one and is representative of a number of said state data in each said individual memory location.

2. The method of claim 1 wherein said grouping further includes multiplexing said state data as input state data which is entered into said DUT as input stimuli during said scan testing, where each said input state data is a separate scan-in state and is entered into said DUT during a device cycle of said DUT.

3. The method of claim 2 wherein said grouping further includes multiplexing said state data as expected state data, where each said expected state data is a separate expected state that is compared with said scan-out state at each said device cycle.

4. The method of claim 2 wherein said multiplexing includes selecting said multiple (m) such that for each tester cycle that occurs at said tester cycle rate, m number of said input state data are exchanged between said individual memory location and said DUT and such that said DUT processes one said scan-in state for each device cycle.

5. The method of claim 4 wherein said device cycle rate is a whole number multiple of said tester cycle rate and said whole number multiple is equal to m, said grouping step thereby including multiplexing m said number of state data into each said individual memory location at each said tester cycle.

6. The method of claim 1 wherein said grouping includes recording said multiple state data of said each tester cycle as logic level parameters at a database when m does not exceed the number of possible said logic level parameters enabled by said scan tester.

7. The method of claim 6 further includes displaying said multiple state data of said each tester cycle as logic level parameters when m does not exceed said number of possible said logic level parameters.

8. The method of claim 1 wherein said grouping includes recording said multiple state data of said each tester cycle as logic level waveforms at a database when m exceeds the number of possible logic level parameters enabled by said scan tester.

9. The method of claim 8 further includes displaying said multiple state data of said each tester cycle as a waveform indicator when m exceeds said number of possible said logic level parameters.

10. The method of claim 1 wherein said step of grouping includes recording said multiple state data of said each tester cycle in individually addressable tester memory locations which are integrated with said scan tester.

11. A system for storing sequences of state data for a scan tester having a tester cycle rate that is less than a device cycle rate of an integrated circuit (IC) undergoing testing, said system comprising:

a source of a plurality of said sequences of said scan-in state data in a format in which each said scan-in state data is a bit which represents a logic state;

a processor operationally coupled to manipulate said plurality of said sequences of scan-in state data from said source, said processor being cooperative with said IC and being enabled for multiplexed state data exchanges such that said sequences of scan-in state data are manipulated at said tester cycle rate and each said scan-in state data within said sequences is manipulated at said device cycle rate; and storage that is coupled with said processor to receive said sequences of scan-in state data at said tester cycle rate, a separate said sequence being input into said IC at each tester cycle such that said scan-in state data is processed by said IC at said each device cycle, said storage being configured into a plurality of separately addressable tester memory locations, each said tester memory location being configured to store one of said sequences of state data.

12. The system of claim 11 wherein each said tester memory location includes at least three multiplexed state data.

13. The system of claim 11 wherein said tester cycle includes a multiple (m) of multiplexed state data, where m is equal to a multiple by which said device cycle rate exceeds said tester cycle rate.

14. The system of claim 11 further comprising a multiplexed state data database.

15. The system of claim 11 further comprising a non-multiplexed state data database.

16. A method of increasing the effective frequency of IC testing comprising the steps of:

providing a first clock for marking device clock cycles;

providing a second clock for marking tester clock cycles, said first clock operating at a frequency m times greater than a frequency of said second clock, where m is greater than one;

multiplexing m data bits into a plurality of multiplexed scan combinations;

storing each said multiplexed scan combinations in a separate memory location; and accessing said each multiplexed scan combination at each said tester clock cycle, while entering said scan-in data bits to a DUT at said frequency of said first clock.

17. The method of claim 16 wherein said steps of multiplexing include selecting a value of m as a multiple that is a whole number.

18. The method of claim 16 further comprising a step of comparing each bit of said multiplexed scan combinations with each expected bit of multiplexed scan combinations to detect faults in operations of said DUT.

* * * * *